US009329034B2

United States Patent
Namai et al.

(10) Patent No.: US 9,329,034 B2
(45) Date of Patent: May 3, 2016

(54) PATTERN DETERMINATION DEVICE AND COMPUTER PROGRAM

(75) Inventors: Hitoshi Namai, Hitachinaka (JP); Satoru Yamaguchi, Hitachinaka (JP); Fumihiro Sasajima, Hitachinaka (JP)

(73) Assignee: Hitachi High-Technologies Corporation, Tokyo (JP)

(*) Notice: Subject to any disclaimer, the term of this patent is extended or adjusted under 35 U.S.C. 154(b) by 82 days.

(21) Appl. No.: 13/882,134

(22) PCT Filed: Oct. 14, 2011

(86) PCT No.: PCT/JP2011/005749
§ 371 (c)(1),
(2), (4) Date: Jun. 25, 2013

(87) PCT Pub. No.: WO2012/056639
PCT Pub. Date: May 3, 2012

(65) Prior Publication Data
US 2013/0270436 A1    Oct. 17, 2013

(30) Foreign Application Priority Data
Oct. 27, 2010    (JP) .................................. 2010-240253

(51) Int. Cl.
*G01B 21/30*    (2006.01)
*H01J 37/28*    (2006.01)

(52) U.S. Cl.
CPC ............... *G01B 21/30* (2013.01); *H01J 37/28* (2013.01); *H01J 2237/24578* (2013.01); *H01J 2237/24592* (2013.01); *H01J 2237/2816* (2013.01); *H01J 2237/2817* (2013.01)

(58) Field of Classification Search
CPC ...................... G01B 21/30; H01J 37/28; H01J 2237/24578; H01J 2237/24592; H01J 2237/2816; H01J 2237/2817
See application file for complete search history.

(56) References Cited

U.S. PATENT DOCUMENTS

| 2004/0222375 | A1 | 11/2004 | Kimura et al. |
| 2005/0116182 | A1* | 6/2005 | Tanaka et al. .............. 250/492.1 |
| 2005/0203715 | A1* | 9/2005 | Tai et al. ....................... 702/183 |
| 2011/0280470 | A1* | 11/2011 | Hayashi ....................... 382/149 |

FOREIGN PATENT DOCUMENTS

| JP | 05-041195 | 2/1993 |
| JP | 05-175496 | 7/1993 |

OTHER PUBLICATIONS

International Search Report issued in International Patent Application No. PCT/JP2011/005749 dated Dec. 27, 2011.

* cited by examiner

*Primary Examiner* — Edward Park
(74) *Attorney, Agent, or Firm* — McDermott Will & Emery LLP

(57) ABSTRACT

An object of the invention is to provide: a sample unevenness device that stably identifies unevenness formed on a sample, regardless of a pattern formation state or image acquisition conditions; and a computer program. As an aspect to achieve the above object, a device and computer program are proposed that obtain the area of a plurality of regions formed by a profile waveform of a given threshold or lower for a profile formed based on a detection signal obtained by scanning with a charged particle beam with respect to the sample; and determine either or both of that a site corresponding to a region with a relatively large area is a concave portion or that a space portion and a site corresponding to a space with a relatively small area is a convex portion or a line portion.

20 Claims, 14 Drawing Sheets

PATTERN DETERMINATION DEVICE AND COMPUTER PROGRAM

RELATED APPLICATIONS

This application is the U.S. National Phase under 35 U.S.C. §371 of International Application No. PCT/JP2011/005749, filed on Oct. 14, 2011, which in turn claims the benefit of Japanese Application No. 2010-240253, filed on Oct. 27, 2010, the disclosures of which Applications are incorporated by reference herein.

TECHNICAL FIELD

The present invention relates to a pattern determination device and computer program, and relates particularly to a suitable device for obtaining identification information of a pattern formed on a semiconductor wafer and computer program.

BACKGROUND ART

A charged particle beam device of a scanning electron microscope or the like is a suitable device in the measurement or observation of a pattern formed on a semiconductor wafer in which miniaturization is progressing. In the related art, PTL 1 discloses a stereo observation method as a method of obtaining three-dimensional information of a sample, and in particular, unevenness information of the sample, using a charged particle beam device.

The stereo observation method generates two images through irradiation of beams from two directions inclined with respect to the sample, performs stereo matching between the two images, calculates a height by determining corresponding points and obtains three-dimensional information.

PTL 2 proposes a technology performing dimension measurement of the pattern by irradiating a beam from an angle with respect to the pattern on the sample.

In PTL 3, unevenness information is obtained by determining whether a site on the sample corresponding to the one base portion to be a convex portion when one base portion having a peak of a profile formed by irradiating a beam converges loosely compared to another base portion or determining a site on the sample corresponding to the one base portion to be a concave portion when the one base portion converges steeply compared to the other base portion.

CITATION LIST

Patent Literature

[PTL 1] JP-A-5-41195
[PTL 2] JP-A-5-175496
[PTL 3] JP-A-2004-251674 (corresponds to U.S. Patent Publication No. US 2004/0222375)

SUMMARY OF INVENTION

Technical Problem

In a case of performing pattern length measurement of a line or space on a sample using a scanning electron microscope, when the widths of the line and space are nearly the same, discrimination therebetween is difficult and there is the possibility of mistaking the location of the length measurement target. In particular, in a case where the contrast between the line and space is low, this problem becomes remarkable.

In addition, as disclosed in PTL 1 or PTL 2, three-dimensional information may be obtained by obliquely irradiating a beam with respect to the sample surface; however, for example, there is a need to match fields of view after the beam is inclined, processing time is needed for performing beam inclining and throughput lowers.

As disclosed in PTL 3, by comparing the inclination to the left or right with respect to the peak of a profile formed by irradiation of a beam, it is possible to determine unevenness; however, this determination is made on the assumption that a peak appears in the shape of a profile of a line in the vicinity of the border of the line and space, and in a case where the magnification is low or a case where the line interval is closely set, this premise is not established depending on the type of sample.

Below, description will be made of a pattern determination device that stably performs identification of unevenness formed on a sample, or identification of a pattern formed by, for example, a double exposure method, regardless of the formation state of the pattern, or the acquisition conditions of the image; and a computer program.

Solution to Problem

As an aspect to achieve the above object, a device and computer program are described that obtain the area of a plurality of regions formed by a profile waveform of a given threshold or lower for a profile formed based on a detection signal obtained by scanning with a charged particle beam with respect to the sample; and determine either or both of that a position corresponding to a region with a relatively large area is a concave portion or a space portion and/or that a position corresponding to a region with a relatively small area is a convex portion or a line portion.

Further, a device and computer program are described that determine a position corresponding to a region with a relatively large area is a core gap of a pattern formed by double exposure, and a position corresponding to a region with a relatively small area is a spacer gap.

In addition, as another aspect to achieve the above object, a device and computer program are described that obtain the area of a plurality of regions formed by a profile waveform of a given threshold or lower for a profile formed based on a detection signal obtained by scanning with a charged particle beam with respect to the sample; and, in a case in which a significant difference between two groups classified according to the size of the area is determined to be present or a case where the area difference of adjacent regions is greater than a predetermined value, determine either or both of that there is a concave portion or a space portion at a position classified on the large side or a position of the side with a relatively large area, and that there is a convex portion or a line portion at a position classified on the small side or a position of the side having a relatively small area.

Further, based on the above classification, a device and computer program determining a core gap and spacer gap of a pattern formed by double exposure are described.

Furthermore, as another aspect for achieving the object, a device and computer program are described that obtain the area of a plurality of regions formed by a profile waveform of a given threshold or lower for a profile formed based on a detection signal obtained by scanning with a charged particle beam with respect to the sample; and, in a case in which a significant difference between two groups classified according to the size of the area is determined to not be present, or a case where the area difference of adjacent spaces is a predetermined value or lower, determine there is a concave portion or space portion at a position corresponding to the plurality of regions.

Further, based on the above classification, a device and computer program determining a core gap and spacer gap of a pattern formed by double exposure are described.

Advantageous Effects of Invention

According to the above configuration, it is possible to stably perform identification of unevenness or a gap formed on a sample, regardless of the formation state of the pattern or the acquisition conditions of the image.

DESCRIPTION OF EMBODIMENTS

Figure 1:
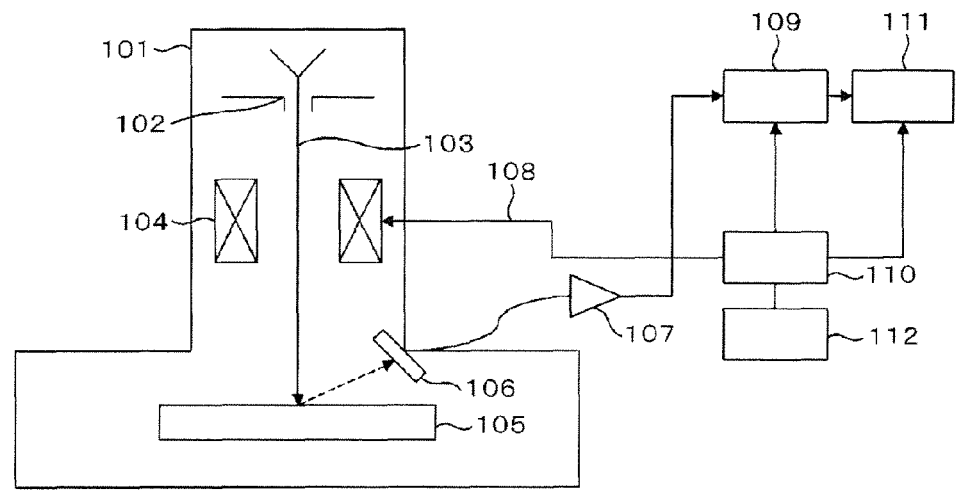
FIG. 1 is a diagram showing a configuration example of a scanning electron microscope.

Below, a device performing unevenness determination of a sample and identification of a pattern formed using a double exposure method will be described using the diagrams.

Embodiment 1

Below, a description will be made relating to a determining method and device of unevenness of a sample, and to a method and device able to stably perform unevenness determination, regardless of the formation state of the pattern or the formation state of the profile.

As a specific aspect, a method and device are described that obtain the area of a plurality of regions formed by a profile waveform of a given threshold or lower for a formed profile, and determine that a site corresponding to a region with a relatively large area is a concave portion or a space portion, or a site corresponding to a region with a relatively small area is a convex portion or line portion.

According to such a configuration, it is possible to realize high precision line and space identification by the generation circumstances of noise or the rising section of an edge portion even in a case where identification of both is difficult without generation of a significant difference in the peak waveform of a line portion and space portion.

As yet another aspect, a method and device are described that obtain an area of a plurality of regions formed by a profile waveform of a given threshold or lower for a formed profile, determine whether or not a significant difference is present between the two groups in which information relating to the area is classified according to the size of the area, and in a case where it is determined that a significant difference is present, determine that a portion for which the area is determined to be large is a concave portion or a space portion, or determine that a portion for which the area is determined to be small is a convex portion or a line portion.

In addition, as yet another aspect, a method and device are described that obtain an area of a plurality of regions formed by a profile waveform of a given threshold or lower for a formed profile, determine whether or not a significant difference is present between two groups in which information relating to the area is classified according to the size of the area, and in a case where it is determined that a significant difference is not present, determine that a space portion is present at a position corresponding to a region for which the area is obtained.

According to such a configuration, it is possible to reliably determine the unevenness (space or line) of a sample even in cases where the number of peaks changes, according to the acquisition conditions of an image or formation conditions of a pattern, for example.

In addition, performing determination of whether or not there is a significant difference using, for example, a two-sample t-test may be considered; however, if it is possible to stably output an area value regardless of noise or the like, determination may be made that a portion positioned on the large side is a concave portion or a space portion or that a portion positioned on the small side is a convex portion or a line portion in a case where the area difference of adjacent spaces is greater than a predetermined value, and determination may be made that a concave portion or space portion is present at any position corresponding to adjacent spaces is a concave portion in a case where the area difference is a predetermined value or lower.

Below, a method and device are described using the diagrams that derive a profile of charged particle intensity based on the detection of charged particles emitted from a scanning location without change to the incidence in the vertical direction with respect to a substrate for which a charged particle beam is ordinarily used, and determine unevenness based on this profile without accompanying inclination of the incident charged particles or optical or mechanical operation of the inclination of the holding stage of a substrate.

According to the embodiment, performing an unevenness determination in a charged particle beam becomes easy, and determining the unevenness condition of a pattern in which a similar pattern such as a pattern of lines and spaces is continuous becomes easy.

In addition, since there is no need for accompanying inclination of incident charged particles, or optical or mechanical operations of the inclination of the holding stage of a substrate, there is almost no influence on throughput, and is particularly effective in automated production processes in which throughput is emphasized.

In addition, the vertical direction referred to in the embodiment indicates the same direction as the irradiation direction of undeflected charged particles in the charged particle optical system, or a direction perpendicular with respect to the movement direction of the sample stage in which the sample is moved in the X-Y direction. However, the charged particle beam device is a device scanning a charged particle beam one-dimensionally or two-dimensionally, and the deflection state in this case does not include the inclined irradiation referred to in the embodiment. In other words, in the embodiment, a charged particle beam irradiated through the optical axis of a charged particle beam (charged particle beam trajectory not deflected by a deflector) is scanned one-dimensionally or two-dimensionally by a scanning deflector. In other words, a charged particle beam is irradiated in a state not deflected by another deflector (vertically incident state).

FIG. 1 shows a configuration example of a scanning electron microscope system. Moreover, in the description below, the description is made taking a scanning electron microscope as an example; however, the example is not limited thereto, and application of other charged particle beam devices, such as a focused ion beam device, is possible. 101 is a case portion of an electron microscope, and an electron beam 103 issued from an electron gun 102 is converged by an electronic lens not shown in the drawings, and irradiated on a sample 105. Secondary electrons generated from the sample surface due to electron beam irradiation or the intensity of reflected electrons are detected by an electron detector 106, and amplified by an amplifier 107. 104 is a deflector in which the position of the electron beam is moved, and the electron beam 103 is raster scanned on the sample surface according to a control signal 108 of a control computer 110.

The signal output from the amplifier 107 is A/D converted in an image processing processor 109, and digital image data is created. 111 is a display device displaying the image data. In addition, the image processing processor 109 includes an image memory accommodating digital image data and an image processing circuit performing various imaging processes; and a display control circuit performing display control. An input means 112, such as a keyboard or mouse, is connected to the control computer 110. The above-described image processing processor 109 or control computer 110 function as an edge detection portion for edge position extraction described later.

Moreover, an address signal corresponding to a memory position of the image memory is generated in the control computer 110, and supplied to the deflector 104 via a scanning coil control power source (not shown in the diagram) after analog conversion. An address signal in the X direction, in the case of, for example, the image memory being 512×512 pixels, is a digital signal repeating from 0 to 511, and an address signal in the Y direction is a repeating digital signal from 0 to 511 to which 1 is added when address signal in the X direction reached 511 from 0. These are converted to an analog signal.

Since the address of the image memory and the address of the deflection signal for scanning the electron beam correspond, a two-dimensional image of the deflection region of the electron beam by the deflector 104 is stored in the image memory. Moreover, a signal in the image memory may be sequentially read out in time series by the read out address generation circuit (not shown in the diagram) synchronized by a read out clock. The signal read out corresponding to the address is analog converted, and becomes a brightness modulation signal of the display device 111.

A function is provided in the image memory by overlapping (synthesizing) and storing an image (image data) for improving the S/N ratio. For example, by storing by overlapping an image obtained by two-dimensional scanning eight times, one completed image is formed. That is, a final image is formed by synthesizing an image formed in one or more X-Y scanning units. The number of images for forming one completed image (frame integration number) may be arbitrarily set and a suitable value is set considering conditions such as the conditions of secondary electron generation efficiency. In addition, it is possible to form an image to be finally acquired by further overlapping a plural number of images formed by integrating a plural number of images. Blanking of a primary electron beam is executed at a point in time when a desired number of images is stored or thereafter, and information input to the image memory may be interrupted.

The sample 105 is arranged on a stage not shown in the drawing, and the sample 105 is able to move in two directions (X direction, Y direction) in a surface vertical to the electron beam.

In addition, the device of the embodiment is provided with a function forming a line profile based on detected secondary electrons or reflected electrons (detection signal) or the like. The line profile is formed based on the detected amount of electrons when one-dimensional or two-dimensional scanning of a primary electron beam is performed or brightness information of a sample image or the like, and the obtained line profile is used in dimension measurement of a pattern formed on a semi-conductor wafer, for example.

Moreover, the description of FIG. 1 describes the control calculator as integrated with the scanning electron microscope, or the equivalent; however, the embodiment is not limited thereto, and the process may be performed as described below by a control processor provided separately to the scanning electron microscope case. In this case, a detection signal detected by the electron detector 106 is transmitted to the control processor, and a transmission medium transmitting a signal to a lens or deflector or the like of scanning electron microscope from the control processor and an input and output terminal inputting and outputting a signal transmitted via the transmission medium are needed.

In addition, a program performing processes described below is registered on a storage medium and the program may be executed by a control processor supplying the needed signal to the scanning electron microscope having an image memory.

Figure 2:
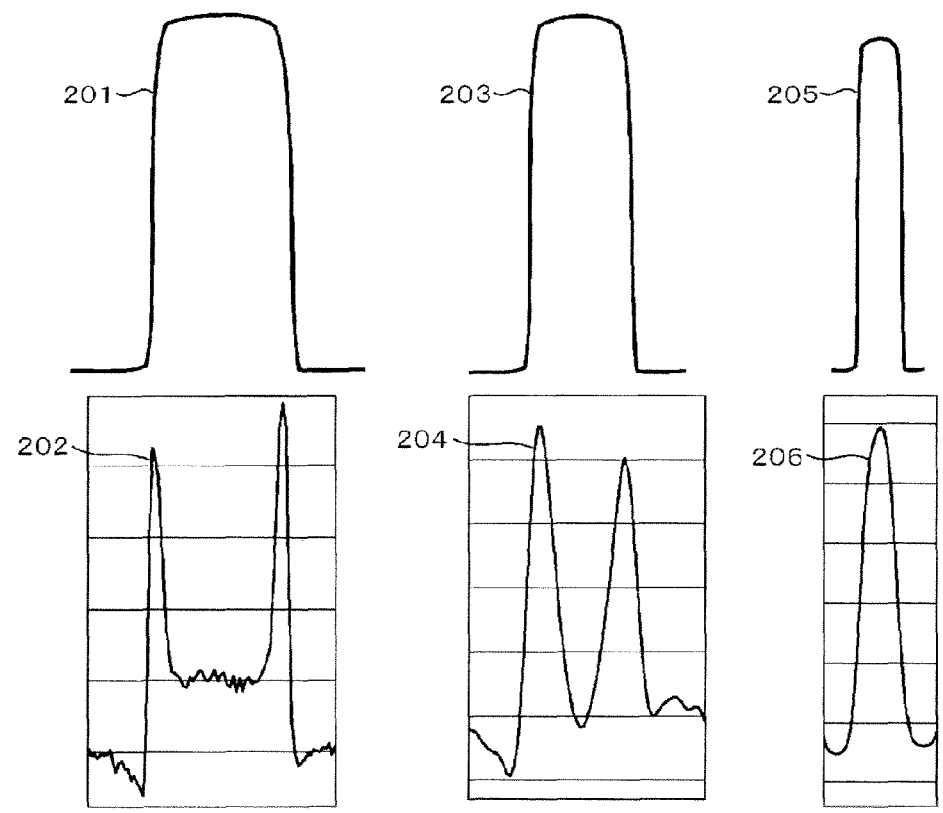
FIG. 2 is a diagram showing a cross-section of a line pattern and the profile thereof.

FIG. 2 is a cross-sectional diagram of a line pattern and a profile thereof. In a case where the line width such as in a pattern 201 is sufficiently large, a peak is generated in the vicinity of the boundary of a line and space as in a profile waveform 202. In this case, it is possible to determine unevenness by comparing the inclination to the left and right with respect to the peak. However, accompanying a narrowing of the line width such as in patterns 203 or 205, there is no significant difference in the inclination to the left and right with respect to a peak such as in a profile waveform 204 and the peaks become one as in a profile waveform 206, and there are cases arise in which the premise assuming the method performing unevenness determination based on the inclination of the base portion of the peak is not achieved.

Figure 3:
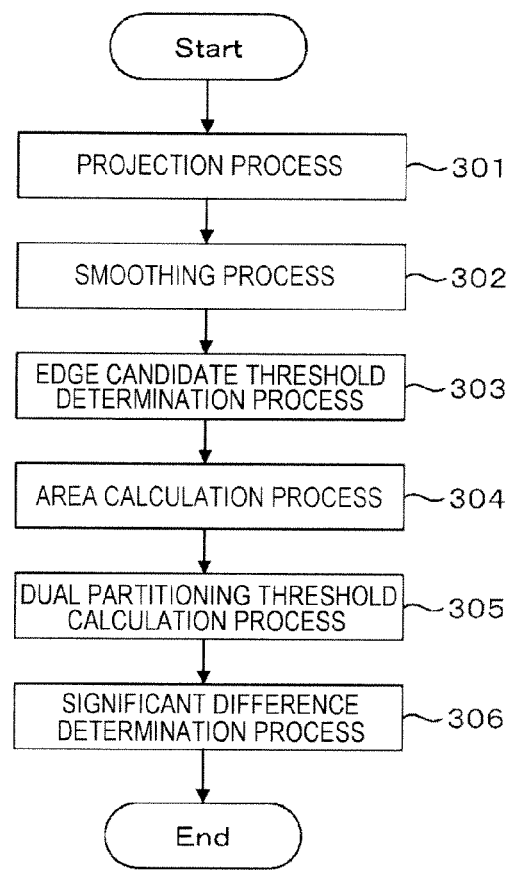
FIG. 3 is a flowchart describing determination process steps of a line and space pattern.
Figure 4:
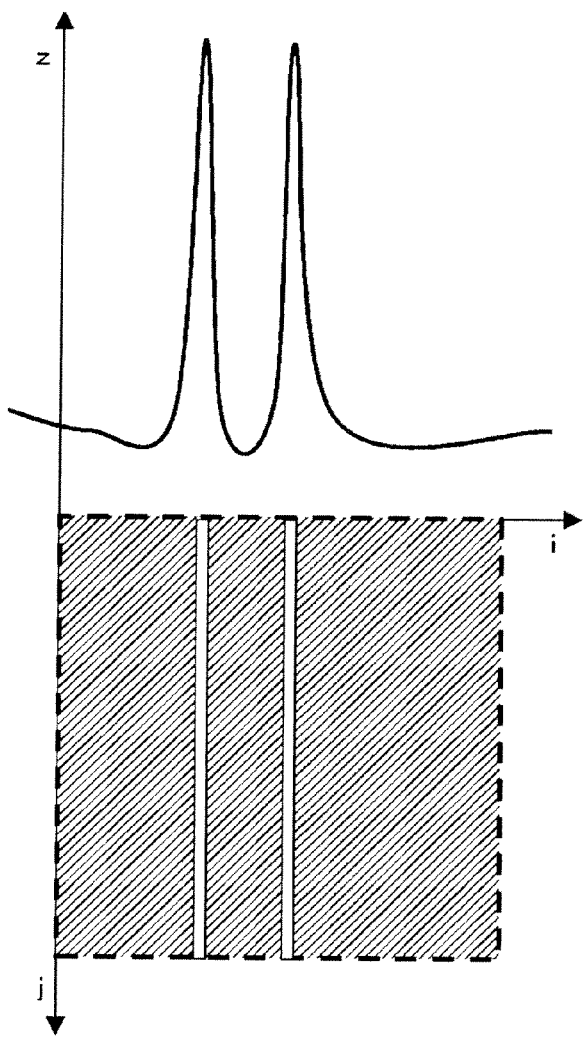
FIG. 4 is a diagram describing a summary of a projection process.

FIG. 3 is a diagram describing an outline of a line space determination process of the embodiment. First, in the projection process (step 301), the pixel value of an image as shown in FIG. 4 is projected on an axis (here, I axis) which is orthogonal to a line, and improvement in the S/N is attempted through taking an arithmetic mean in the line segment direction of the line. When the image size is set to (M, N), the projection process may be shown by Expression 1. Here, I(i,j) is the pixel value over the image coordinates (i,j).

[Equation 1]

$$z(i) = \sum_{j=0}^{N} I(i, j)/N \quad \text{(Expression 1)}$$

In addition, in the smoothing process (step 302), improvements in the S/N are attempted by performing smoothing using a moving average as shown in Expression 2.

[Equation 2]

$$s(i) = \frac{1}{L} \sum_{k=-\frac{L-1}{2}}^{\frac{L-1}{2}} z(i+k) \quad \text{(Expression 2)}$$

In the edge candidate threshold determination process (step 303), an edge candidate threshold (first threshold) is obtained from the profile for separating a convex portion (line portion) and a concave portion (space portion).

Figure 5:
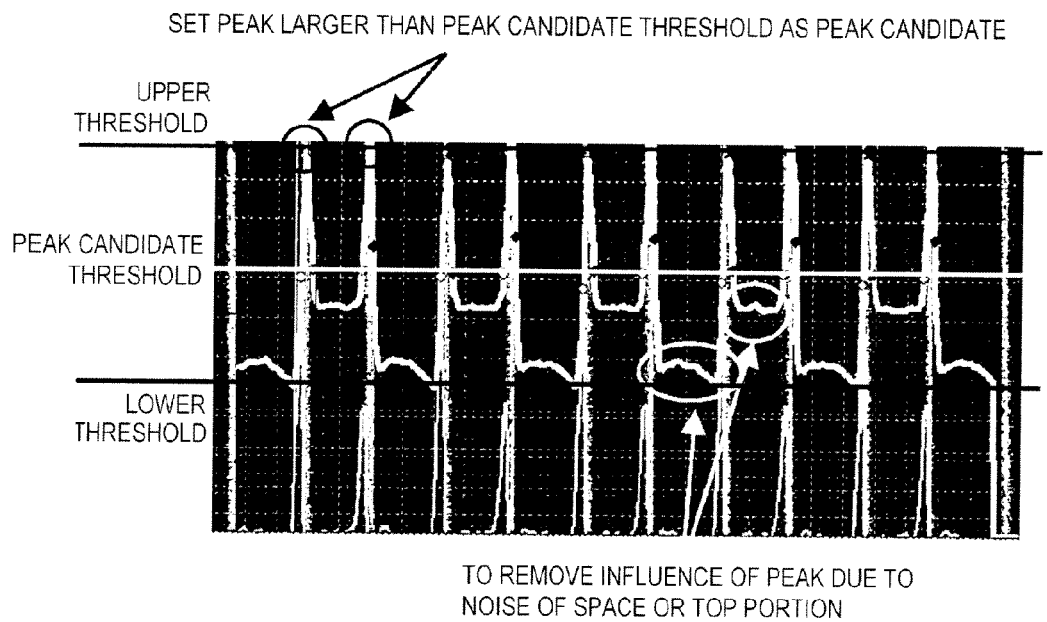
FIG. 5 is a diagram showing a summary of an edge candidate threshold determination process (peak candidate determination portion).

First, the peak of a smoothing profile which is a line candidate is detected. Here, as shown in FIG. 5, the representative value of an upper peak (upper threshold: second threshold) corresponding to a convex portion (line portion) and a representative value of a lower peak (lower threshold: third threshold) corresponding to a concave portion (space portion) are determined, and a peak candidate threshold (fourth threshold) is set as a position exactly half of the upper threshold and lower threshold. A peak exceeding this peak candidate threshold (fourth threshold) is detected as a peak candidate.

At this time, in order to remove the influence of a pseudo peak generated by noise of a space or top portion, the upper threshold (second threshold) is obtained by calculating an average of a peak exceeding the average value of the upper peak, and the lower threshold (third threshold) is obtained by calculating an average of a peak dropping below the average of the lower peak.

Figure 6:
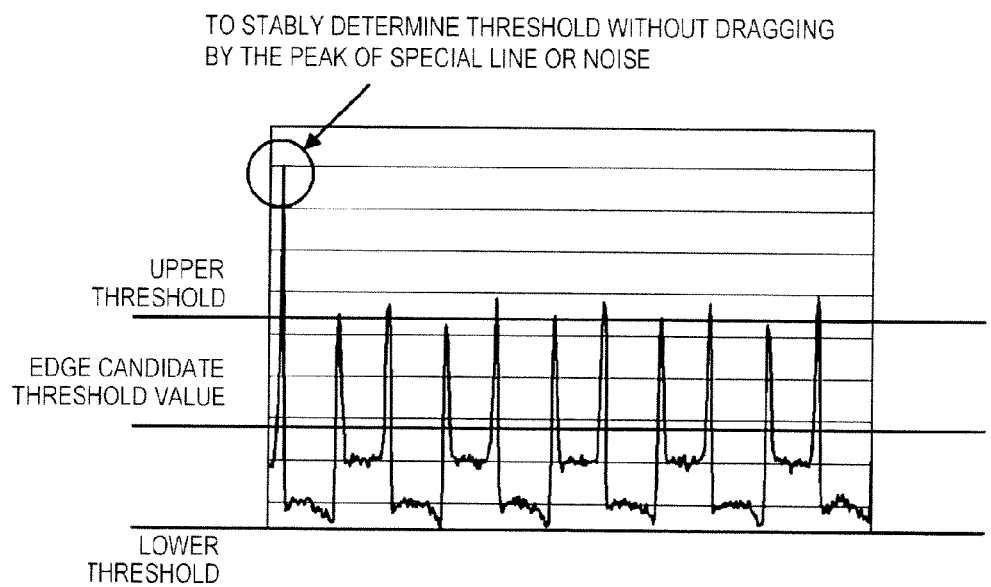
FIG. 6 is diagram showing a summary of an edge candidate threshold determination process (edge candidate threshold determination portion).

Next, the edge candidate threshold (first threshold) is obtained. In order that the peak of a special line or noise as shown in FIG. 6 is not drawn in, the upper threshold (fifth threshold) is obtained by calculating the median value of a peak candidate exceeding the peak candidate threshold (fourth threshold) detected above, and the lower threshold (sixth threshold) is set to the minimum value of the lower peak. The edge candidate threshold (first threshold) is a position exactly half of the upper threshold (fifth threshold) and the lower threshold (sixth threshold).

Here, in a case where there is no peak of special line or noise as shown in FIG. 6, the peak candidate threshold (fourth threshold) may be set as the edge candidate threshold (first threshold).

Figure 7:
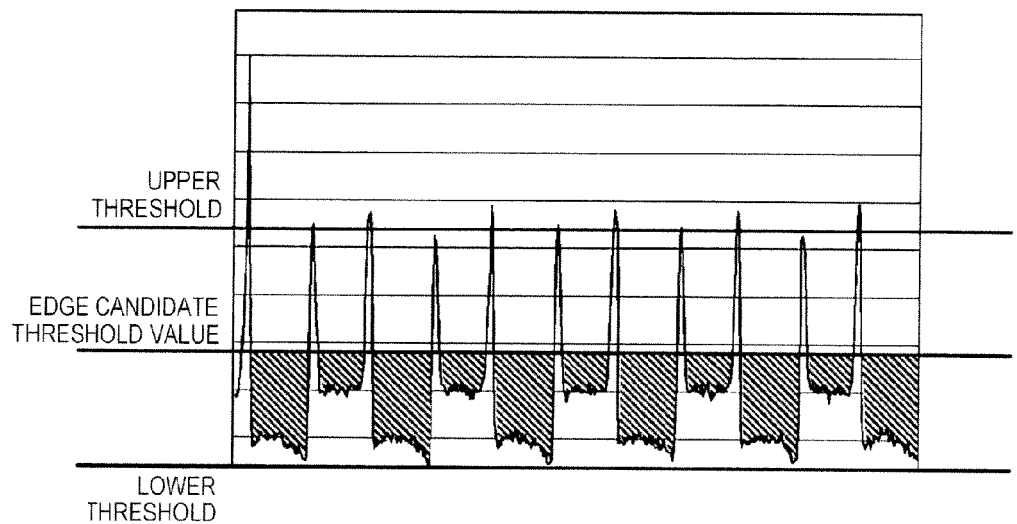
FIG. 7 is a diagram showing a summary of an area calculation process.
Figure 8:
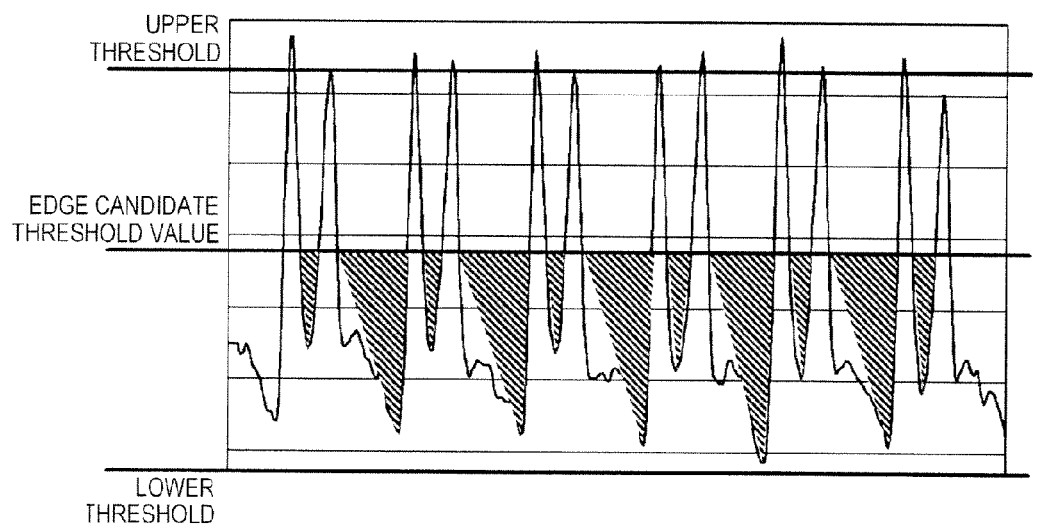
FIG. 8 is a diagram showing an alternative solution of the area calculation method in the area calculation process.

In the area calculation process (step 304), a portion of the areas of the regions formed by the edge candidate threshold and the smoothing profile obtained in step 303 as shown in FIG. 7 is obtained, and the area of the portions below the edge candidate threshold is obtained. At this time, in a case where there is influence of variations due to noise of the bottom, when the area is accurately computed, the area may approximate a triangular area connecting a total of three points of the two intersection points of the edge candidate threshold value and the smoothing profile and the minimum value for the smoothing profile. In addition, after the signal is cut in a uniform manner for a predetermined signal quantity from the minimum value of the profile and each region, the area of each region may be obtained. If the relationship of the area of a line portion and a space portion or an adjacent region may be accurately specified, the method is not relevant.

Figure 9:
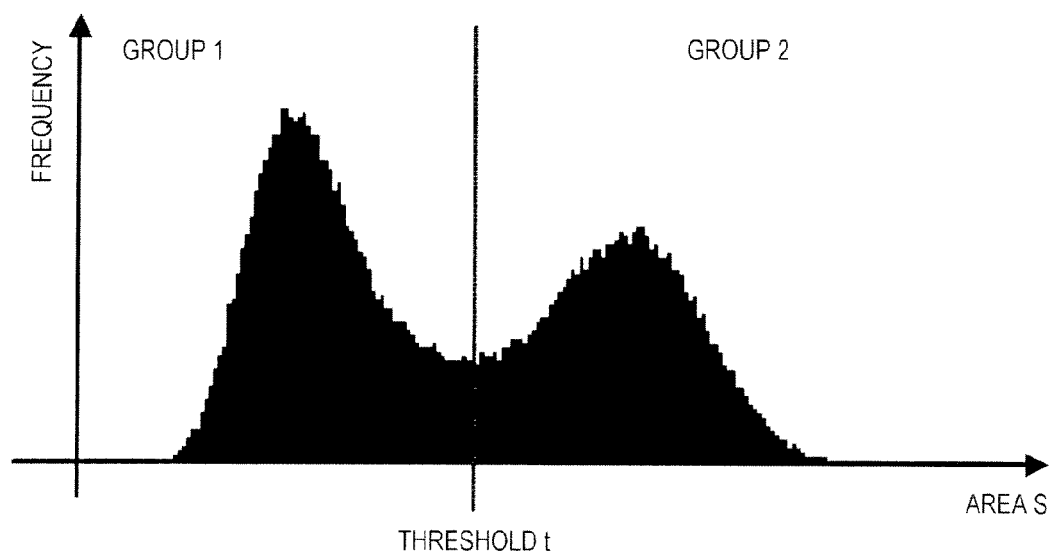
FIG. 9 is a diagram showing a summary of a dual partitioning threshold calculation process.

In the dual partitioning threshold calculation process (step 305), a histogram is created of the area obtained in the area calculation process shown in FIG. 9, and the optimal threshold for partitioning into two groups is obtained from histogram. As a method of obtaining the threshold, various methods such as the Otsu discriminant analysis method introduced in "Image Processing Handbook, New Edition" by Takagi Mikio and Shimoda Haruhisa (supervisor), University of Tokyo Press 2004, or the Kittler method have been proposed, and may be used.

Figure 10:
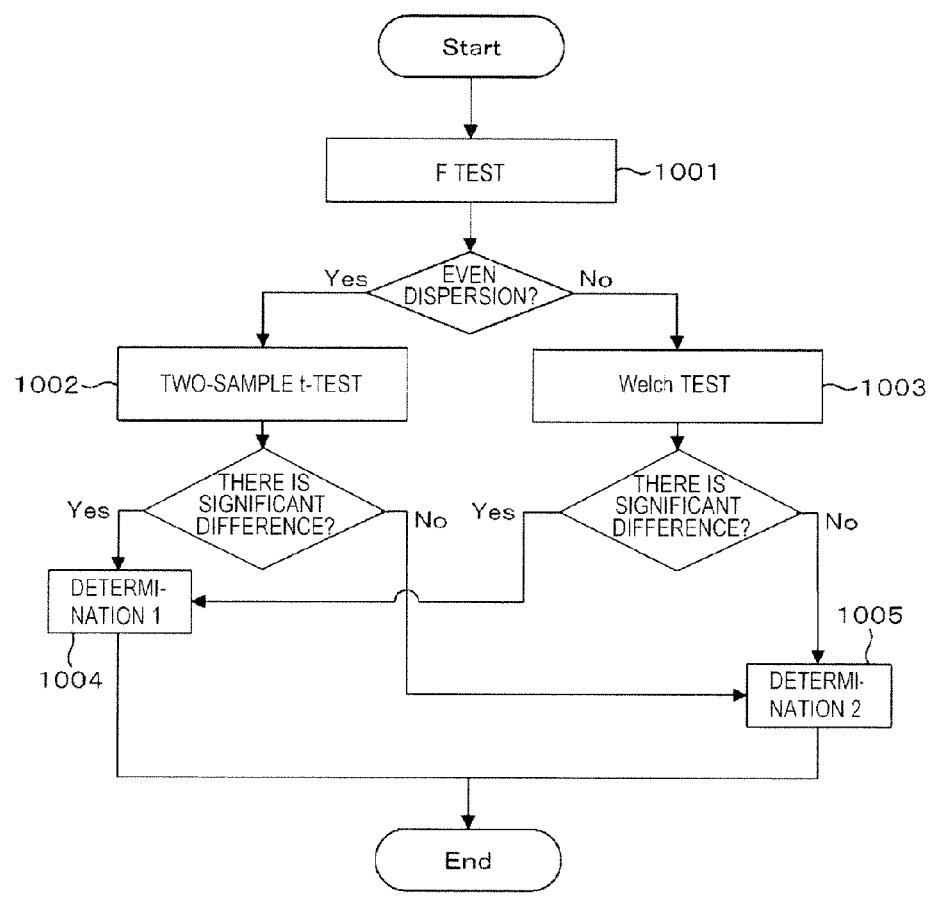
FIG. 10 is a diagram showing a summary of a significant difference determination process.

In the significant difference determination process (step 306), the process is one determining whether or not there is a significant difference between the two groups classified by the threshold obtained in the dual partitioning threshold calculation process. FIG. 10 is a process flow of a significant difference determination process. First, an F test (step 1001) is performed, and testing of whether or not the dispersion of the two groups is an even dispersion is performed. In a case where it is determined to be an even dispersion, determination of whether or not there is a significant difference between the two groups is performed using a two-sample t-test (step 1002). In a case where there is a significant difference, in the "Determination 1" in step 1004, the portion corresponding to the group with the larger area of the two groups is determined to be a space portion. On the other hand, it is possible to determine a portion corresponding to the relatively small group is a line portion, and it is possible to perform the line and space determination together; however, in a case where the measurement target is only a line pattern or only a space portion, for example, either determination only may be selectively performed. In a case where there is no significant difference, in "Determination 2" in step 1005, the portion corresponding to both of the two groups is determined to be a space portion.

In a case where it is determined to not be an even dispersion, determination of whether or not there is significant difference between the two groups is performed using a Welch test (step 1003), and in the case in which there is a significant difference, in "Determination 1" of step 1004, the portion of the two groups corresponding to the larger area is determined to be a space portion. In a case where there is no significant difference, in "Determination 2" in step 1005, the portion corresponding both of the two groups is determined to be a space portion.

Figure 11:
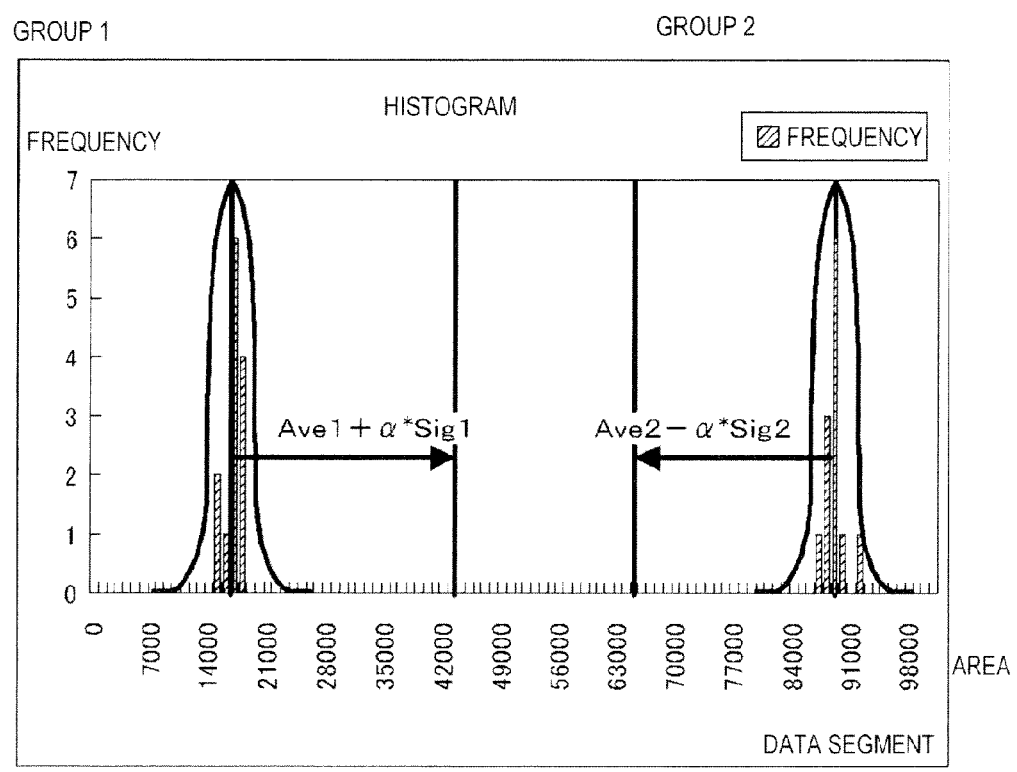
FIG. 11 is a diagram showing an alternative solution of significant difference determination in the significant difference determination process.

Here, a Mann-Whitney test may be used in place of the Welch test of step 1003. In addition, in place of the flow in FIG. 10, it is assumed that the two groups follow a normal distribution, and it may be determined whether or not there is a significant difference by whether or not Expression 3 is achieved as shown in FIG. 11. Here, Ave1: average value of group 1, Ave2: average value of group 2, Sig1: variance of group 1, Sig2: variance of group 2, and α are arbitrary constants.

[Equation 3]

$$Ave1+\alpha*Sig1 < Ave2-\alpha*Sig2 \quad \text{(Expression 3)}$$

In addition, until now description has been made for a method determining the size of an area of a region defined by a profile waveform based on statistical testing methods; however, in a case where the area difference of a line portion and space portion is large, the area of adjacent regions, for example, may be compared and the relatively larger area may be determined to be a space portion and the smaller area to be a line portion. However, when resistance to noise or adaptability with respect to changes in the pattern shape are considered, it is desirable that the above-described statistical testing methods be used.

Figure 12:
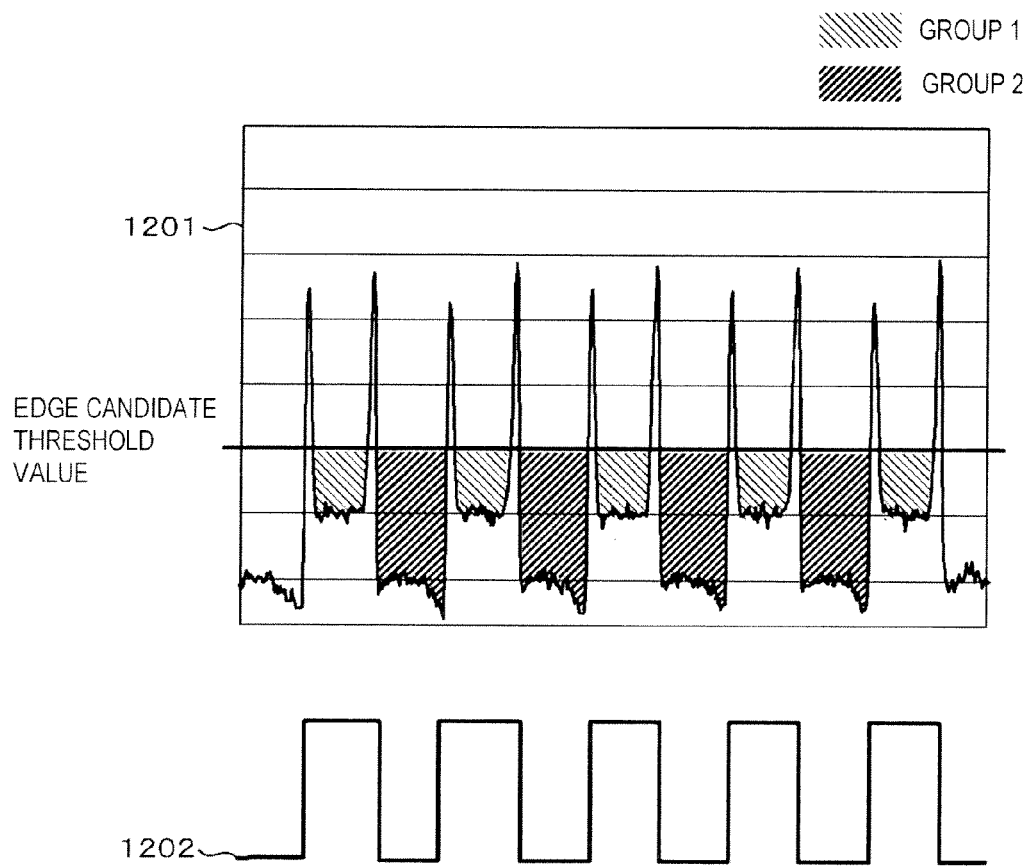
FIG. 12 is a diagram showing an example in which each region is classified based on the area of a plurality of regions defined by a line segment of a profile waveform and edge candidate threshold.

With respect to the pattern 201, an example of unevenness determination performed based on the significant difference determination process is shown in FIG. 12. Among the areas formed by the edge candidate threshold and the smoothing profile, the area of a portion that is below the edge candidate threshold is classified into group 1 and group 2 as in FIG. 12 by the dual partitioning threshold calculation process (step 305). In the significant difference determination process (step 306), these two groups are determined to have a significant difference, and the portion corresponding to group 2 is determined to be a concave portion (space portion) and other portions to be a convex portion (line portion), as in the unevenness determination results 1202.

Figure 13:
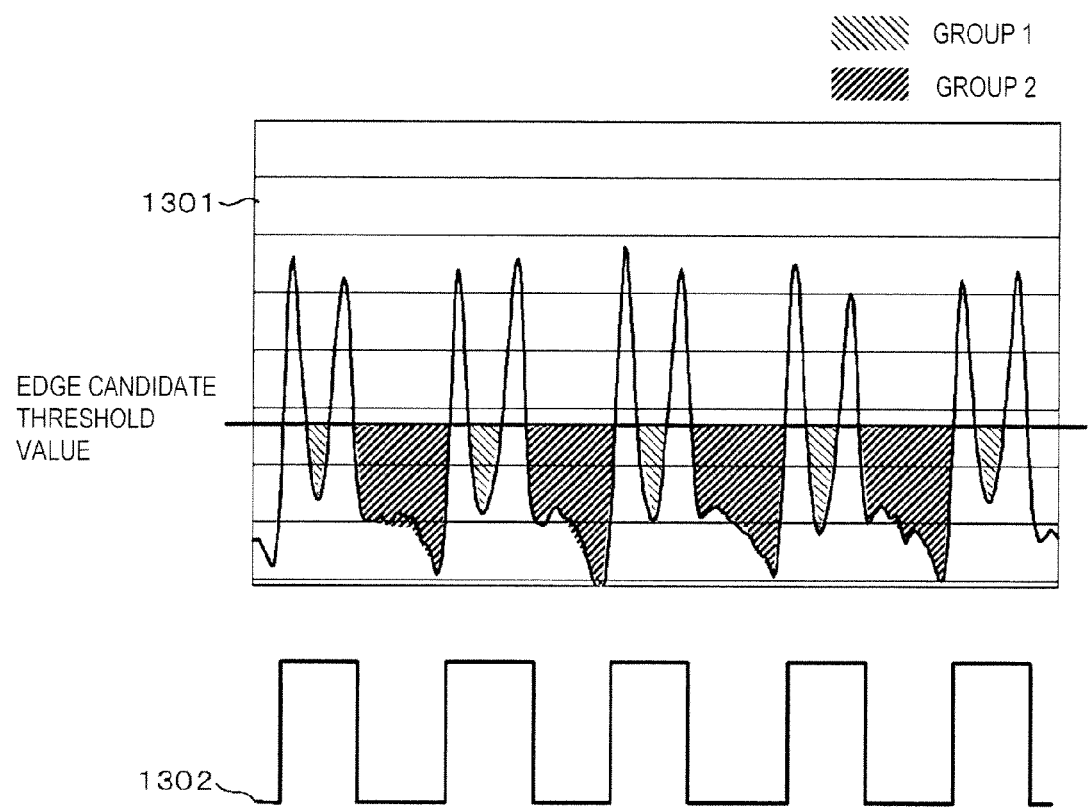
FIG. 13 is a diagram showing an example in which each region is classified based on the area of a plurality of regions defined by a line segment of a profile waveform and edge candidate threshold.

With respect to the pattern 203, an example of unevenness determination performed based on the significant difference determination process is shown in FIG. 13. Among the areas formed by the edge candidate threshold and the smoothing profile, the area of a portion that is below the edge candidate threshold is classified into group 1 and group 2 as in FIG. 13 by the dual partitioning threshold calculation process (step 305). In the significant difference determination process (step 306), these two groups are determined to have a significant difference, and the portion corresponding to group 2 is determined to be a concave portion (space portion) and other portions to be a convex portion (line portion), as in the unevenness determination results 1302.

Figure 14:
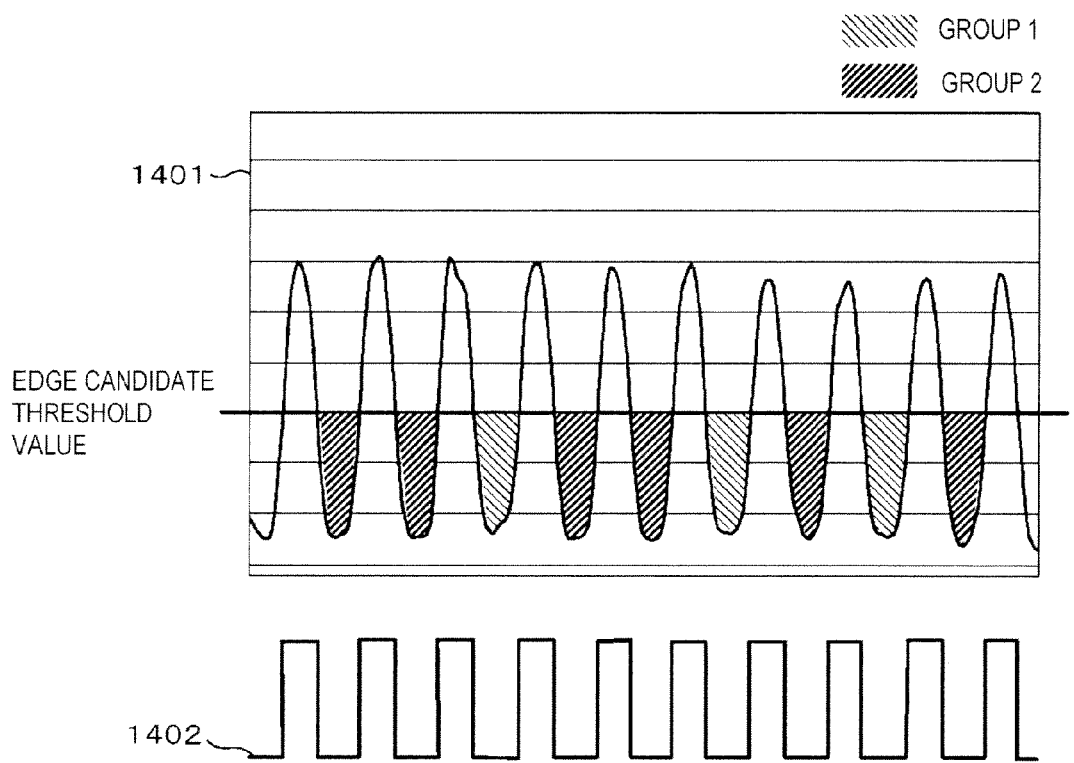
FIG. 14 is a diagram showing an example in which each region is classified based on the area of a plurality of regions defined by a line segment of a profile waveform and edge candidate threshold.

With respect to the pattern 205, an example of unevenness determination performed based on the significant difference determination process is shown in FIG. 14. Among the areas formed by the edge candidate threshold and the smoothing profile, the area of a portion that is below the edge candidate threshold is classified into group 1 and group 2 as in FIG. 14 by the dual partitioning threshold calculation process (step 305). In the significant difference determination process (step 306), these two groups are determined to not have a significant difference, and the portion corresponding to group 1 and group 2 is determined to be a concave portion (space portion) and other portions to be a convex portion (line portion), as in the unevenness determination results 1402.

As illustrated by example in FIG. 12 to FIG. 14, according to the unevenness determination method based on the significant determination, even in a case where two peaks are formed or a case where one peak is formed with respect to one line pattern, it is possible to stably perform unevenness determination. Specifically, regardless of a case where the magnification of the scanning electron microscope is low or there is a fine pattern and consequently a number of line patterns are included in the FOV (Field of View) (that is, a state such as in FIG. 14) or a case in which the peak of an edge portion is clearly realized as illustrated by example in FIG. 12 or FIG. 13, it is possible to stably perform unevenness determination.

Embodiment 2

Next, an example is described using a determination method using the area in a waveform as described above in the identification of a pattern formed by a double exposure method. In recent years, a pattern forming method known as a self-aligning type double patterning (Self Aligned Double Patterning, hereinafter, referred to as SADP) is proposed as one method of satisfying a demand accompanying the demand for patterns of increasing fineness formed on a semiconductor sample.

Gaps are alternately formed in different steps between a plurality of patterns formed by SADP. In order to properly perform process management or the like in each step, there is a need to perform measurement in specifying the type of gap.

SADP is a technology creating a pattern repeating lines and spaces arranged at an extremely narrow pitch of an exposure limit or lower reachable by an exposure device of the related art.

In practice, a first mask pattern is removed by etching with respect to the first mask pattern formed by etching a mask layer by forming a first mask layer on a sample and a second mask pattern formed only on a sidewall of the first mask pattern by etching a second mask layer by forming the second mask layer on the first mask pattern (hereinafter, referred to as a spacer), and a line pattern is formed on a sample by etching with a spacer remaining on the sample as a mask. Thereby, the dimensions of the spacer determine the dimensions of the line pattern formed on the sample. Accordingly, in the case of a pattern formed using SADP, the dimensions of the spacer are measured, the measurement results are fed back to the process determining the dimensions of the spacer, and it is extremely important that the dimensions of the spacer be accurately controlled based on the measurement results.

In addition, the spacer is formed by an upper face connecting two side faces with differing inclinations (first side face, second side face) and the face. In a side surface of the spacer, there are a first concave portion (hereinafter, referred to as a core gap) formed by removing through etching the first mask pattern adjacent to the first side face of the spacer, and a second concave portion (hereinafter, referred to as a spacer gap) formed by working through etching the second mask pattern adjacent to the second side face of the spacer. The core gap and the spacer gap are formed by differing processes, and the dimensions of the core gap and the dimensions of the spacer gap are each controlled by separate processes. In order for the dimensions of the gaps to determine the dimensions between line patterns during line pattern formation, in controlling the dimensions of the pattern, the spacer and core gap, and spacer gap are each separately measured, the dimension values are fed back to the process controlling each of the dimensions, and there is a need to change the implementation conditions of the process on the basis of the dimension value.

According to the above, in order to separately measure the spacer, core gap and spacer gap, there is a need for functions determining each of these.

Figure 15:
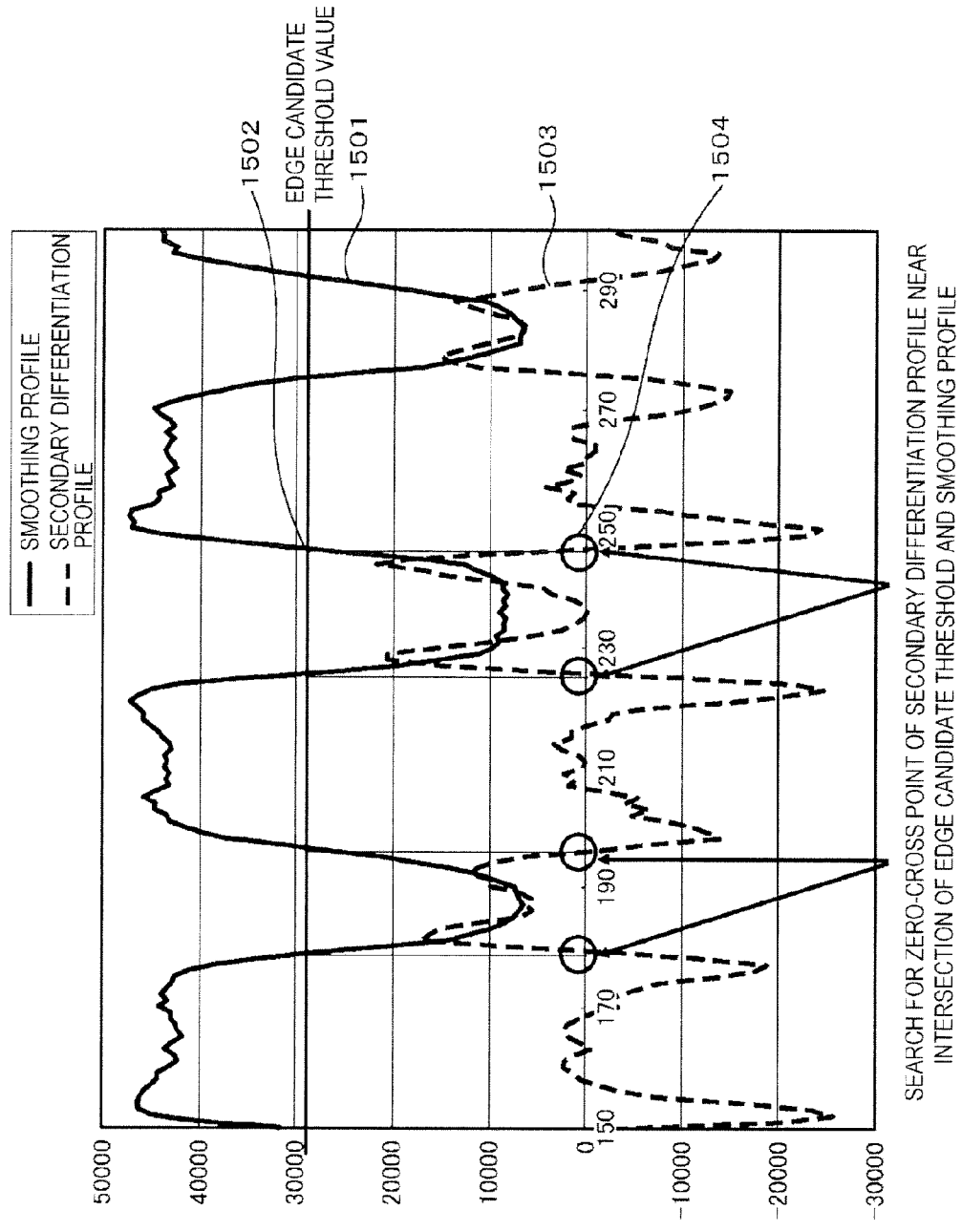
FIG. 15 is a diagram showing one example of a profile waveform of a pattern formed by SADP.
Figure 16:
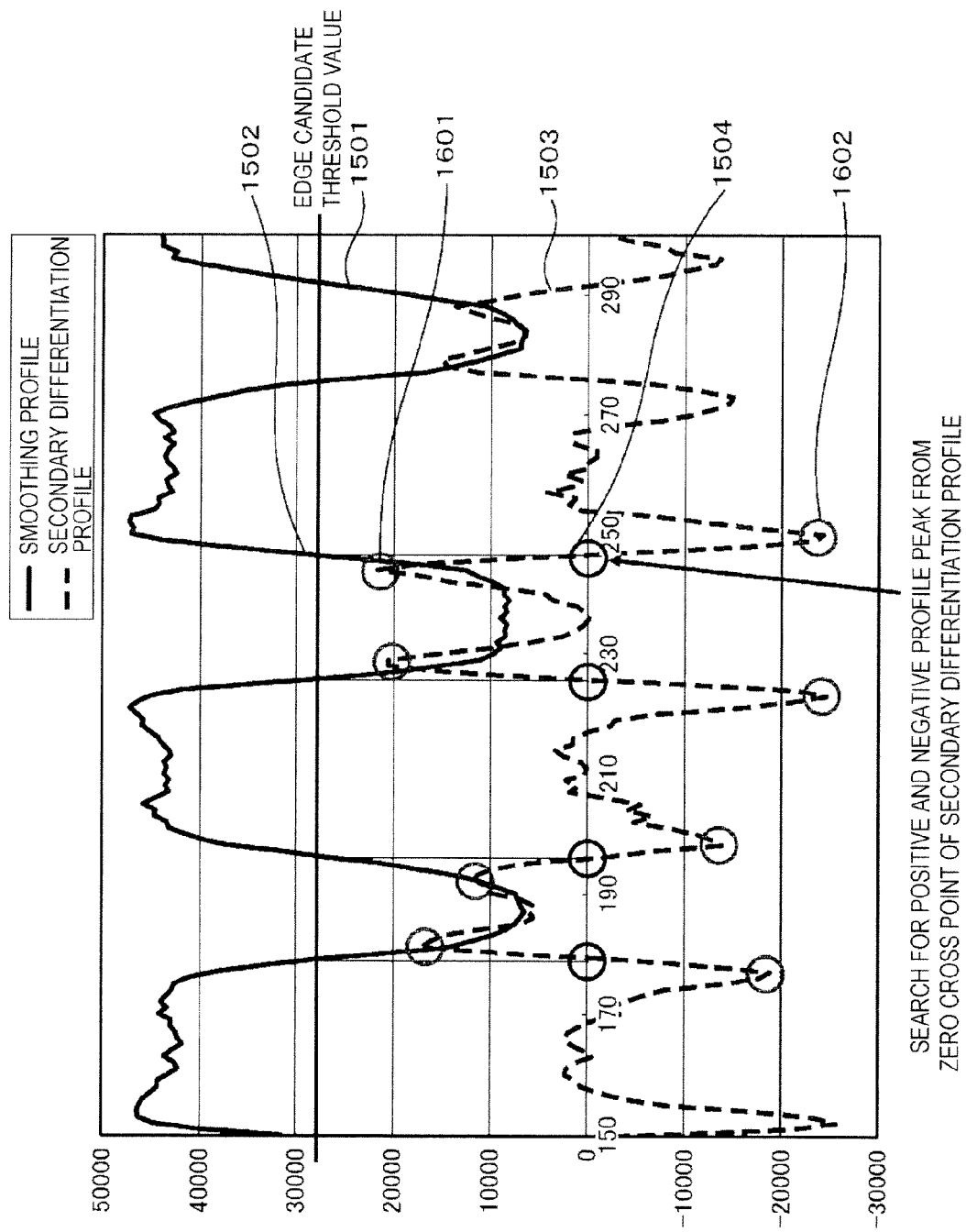
FIG. 16 is a diagram showing a detection example of a peak position of a secondary differentiation waveform formed based on the profile of a pattern formed by SADP.

The basic process for performing discrimination of the spacer gap and core gap obtains the edge candidate threshold (step 303) after performing the projection process (step 301) and smoothing process (step 302), as illustrated by example in FIG. 3. Next, similarly to the unevenness determination, area computation is performed in the waveform; however, different to the unevenness determination, since the discrimination target is any concave portion (gap), a suitable computation process is executed. First, as illustrated by example in FIG. 15, the zero cross point 1504 of the edge candidate threshold and the secondary differentiation profile waveform 1503 close to the intersection point 1502 of the smoothing profile waveform 1501 is searched for. The secondary differentiation profile 1503 is created in advance from a waveform obtained based on the projection process. Next, peaks are searched for towards both positive and negative side with the zero cross point 1504 as a starting point, and the upper peak 1601 and lower peak 1602 are detected.

Figure 17:
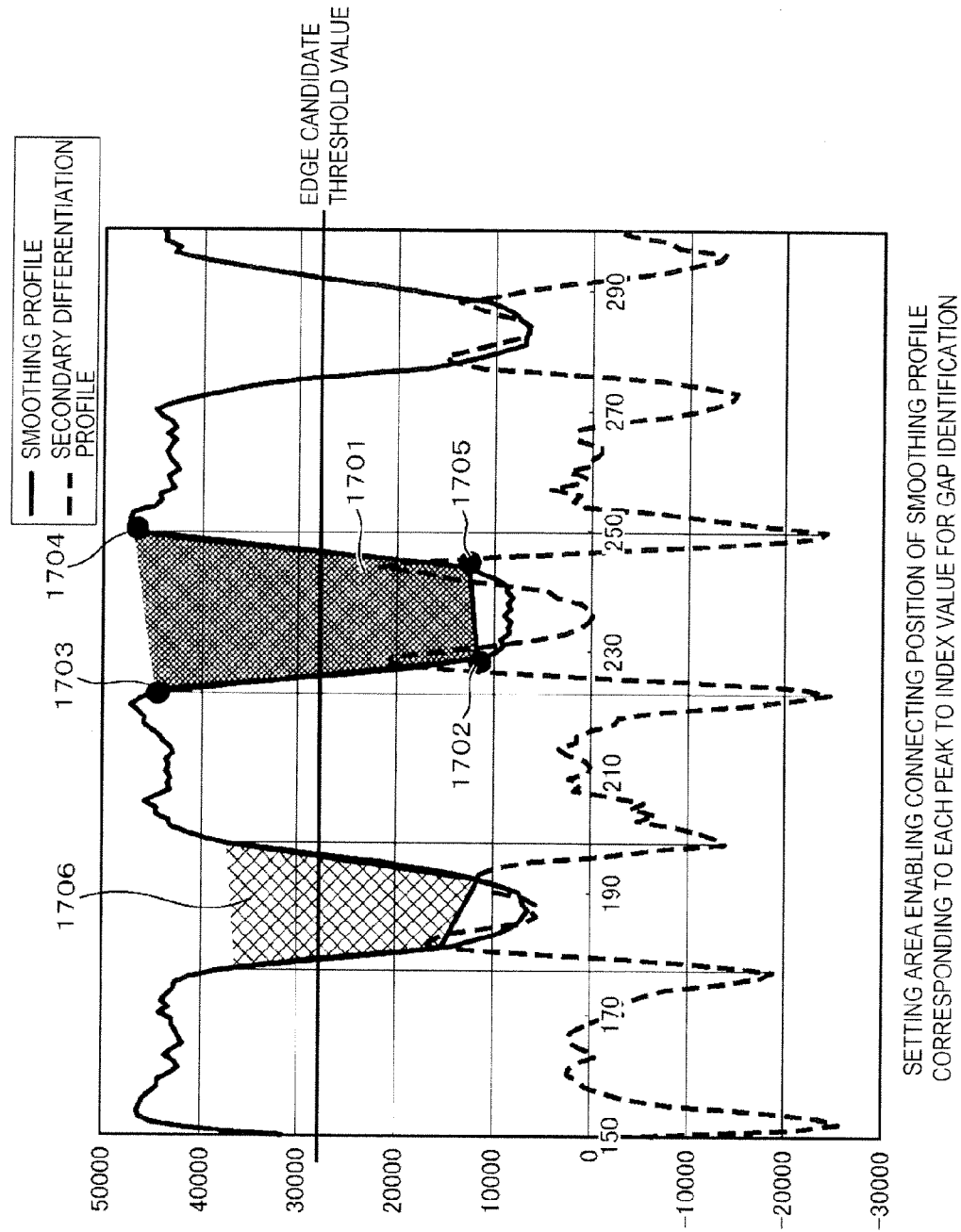
FIG. 17 is a diagram showing an example obtaining the area of a gap portion based on the profile of a pattern formed by SADP.

Two lower peaks and two upper peaks may be obtained at site corresponding to one gap of the smoothing profile waveform by performing the above process. Further, as illustrated by example in FIG. 17, the two upper peaks and two lower peaks and a position (intersection point with the smoothing profile waveform when a straight line is drawn in the vertical axis direction with the upper peak and lower peak as an origin point) of the smoothing profile waveform having the same value in the horizontal axis direction are set as the origin point for obtaining the area of a waveform portion corresponding to a gap. In the case of FIG. 17, it is possible to set the origins 1702 to 1705 to the gap portion 1701 of the waveform. In the example, the area of a closed figure able to connect these four points is obtained. It is possible to obtain an area using an integral or the like based on the position of the origin point. In addition, according to the research of the inventors, it is understood that side with the wider area is a core gap and the narrower area is a spacer gap. Thereby, in the case of the example of FIG. 17, it is possible to determine a position on the sample corresponding to the gap portion 1701 as a core gap and a position on the sample corresponding to the gap portion 1706 as a spacer gap.

In addition, similarly to Embodiment 1, the area of a plurality of sites is obtained, in a case where, along with grouping these according to area, it is determined that there is a significant area difference between groups, determination of a core gap and spacer gap may be performed. Also in Embodiment 2, it is possible to discriminate between two types of pattern (core gap and spacer gap) based on the significant difference determination similarly to Embodiment 1.

REFERENCE SIGNS LIST

101 electron microscope
102 electron gun
103 electron beam
104 deflector
105 sample
106 electron detector
107 amplifier
108 control signal
109 image processing processor
110 control computer
111 display device
112 input means

The invention claimed is:

1. A determination device identifying at least one of a convex portion and a concave portion formed on a sample, the determination device comprising
an image processor configured to obtain a profile waveform based on a detection signals obtained by scanning the sample with a charged particle beam;
a control computer to which the image processor is coupled;
a memory storing a program causing the control computer, when executed, to be configured to:
perform either or both of concave portion determination and convex portion determination of a sample based on the profile waveform;
set a first threshold to the profile waveform so as to form at least two size regions which are defined based on the first threshold and the profile waveform below the first threshold;
classify the regions into first and second groups based on calculation of sizes of the regions; and
determine either or both of that a site corresponding to a region which belongs to the first group having larger regions than the second group is a concave portion or a space portion, and that a site corresponding to a region which belongs to the second group having smaller regions than the first group is a convex portion or a line portion,
wherein the control computer sets a center of a second threshold obtained based on an upper peak of the profile waveform and a third threshold obtained based on a lower peak as the first threshold.

2. The determination device according to claim 1, wherein the control computer obtains an area inside a region for which a contour is defined by a line segment indicating the first threshold and the profile waveform.

3. The determination device according to claim 1, wherein the control computer determines either or both of that a site corresponding to a region which belongs to the first group having larger regions than the second group is a concave portion or a space portion, and that a site corresponding to a region which belongs to the second group having smaller regions than the first group is a convex portion or a line portion, in a case where it is determined that a significant difference is present between the first and second groups.

4. The determination method according to claim 3, wherein the control computer performs determination of the significant difference based on a two-sample t-test.

5. The determination device according to claim 1, wherein the control computer determines either or both of that a site corresponding to a region which belongs to the first group having larger regions than the second group is a concave portion or a space portion, and that a site corresponding to a region which belongs to the second group having smaller regions than the first group is a convex portion or a line portion, in a case where the difference of areas of adjacent regions in an area of a plurality of regions is larger than a predetermined value.

6. The determination device according to claim 1, wherein the control computer determines a site corresponding to the plurality of regions is a concave portion or a space portion, in a case where it is determined that a significant difference is not present between the two groups.

7. The determination device according to claim 6, wherein the control computer executes determination of the significant difference based on a two-sample t-test.

8. The determination device according to claim 1, wherein the control computer determines a site corresponding to the plurality of regions is a concave portion or a space portion in a case where a difference between areas of adjacent regions within an area of a plurality of regions is a predetermined value or lower.

9. A non-transitory computer readable storage medium storing a program to be executed by a computer to execute either or both of a concave portion determination and a convex portion determination of a sample based on a profile formed from a detection signal obtained by scanning a charged particle beam with respect to a sample,
wherein the program causes the computer to
set a first threshold to the profile waveform so as to form at least two size regions which are defined based on the first threshold and the profile waveform below the first threshold;
classify the regions into first and second groups based on calculation of sizes of the regions, and
determine either or both of that a site corresponding to a region which belongs to the first group having larger regions than the second group is a concave portion or a space portion, and that a site corresponding to a region which belongs to the second group having smaller regions than the first group is a convex portion or a line portion,
wherein the program causes the computer to set a center of a second threshold obtained based on an upper peak of the profile waveform and a third threshold obtained based on a lower peak as the first threshold.

10. The non-transitory computer readable storage medium according to claim 9, wherein the program causes the computer to obtain an area inside a region for which a contour is defined by a line segment indicating the first threshold and the profile waveform.

11. A determination device identifying at least one of a convex portion and a concave portion formed on a sample, the determination device comprising
an image processor configured to obtain a profile waveform based on a detection signals obtained by scanning the sample with a charged particle beam;
a control computer to which the image processor is coupled;
a memory storing a program causing the control computer, when executed, to be configured to:
perform either or both of concave portion determination and convex portion determination of a sample based on the profile waveform;
set a first threshold to the profile waveform so as to form at least two size regions which are defined based on the first threshold and the profile waveform below the first threshold;
classify the regions into first and second groups based on calculation of sizes of the regions; and
determine either or both of that a site corresponding to a region which belongs to the first group having larger regions than the second group is a concave portion or a space portion, and that a site corresponding to a region which belongs to the second group having smaller regions than the first group is a convex portion or a line portion,
wherein the control computer sets a center of a second threshold obtained based on an upper peak of the profile waveform and a third threshold obtained based on a lower peak as a fourth threshold, and sets a center of a fifth threshold obtained based on a median value of an upper peak exceeding a fourth threshold and a sixth threshold obtained based on a value of a lower peak as the first threshold.

12. The determination device according to claim 11, wherein the control computer obtains an area inside a region for which a contour is defined by a line segment indicating the first threshold and the profile waveform.

13. The determination device according to claim 11, wherein the control computer determines either or both of that a site corresponding to a region which belongs to the first group having larger regions than the second group is a concave portion or a space portion, and that a site corresponding to a region which belongs to the second group having smaller regions than the first group is a convex portion or a line portion, in a case where it is determined that a significant difference is present between the first and second groups.

14. The determination method according to claim 13, wherein the control computer performs determination of the significant difference based on a two-sample t-test.

15. The determination device according to claim 11, wherein the control computer determines either or both of that a site corresponding to a region which belongs to the first group having larger regions than the second group is a concave portion or a space portion, and that a site corresponding to a region which belongs to the second group having smaller regions than the first group is a convex portion or a line portion, in a case where the difference of areas of adjacent regions in an area of a plurality of regions is larger than a predetermined value.

16. The determination device according to claim 11, wherein the control computer determines a site corresponding to the plurality of regions is a concave portion or a space portion, in a case where it is determined that a significant difference is not present between the two groups.

17. The determination device according to claim 16, wherein the control computer executes determination of the significant difference based on a two-sample t-test.

18. The determination device according to claim 17, wherein the control computer determines a site corresponding to the plurality of regions is a concave portion or a space portion in a case where a difference between areas of adjacent regions within an area of a plurality of regions is a predetermined value or lower.

19. A non-transitory computer readable storage medium storing a program to be executed by a computer to execute either or both of a concave portion determination and a convex portion determination of a sample based on a profile formed from a detection signal obtained by scanning a charged particle beam with respect to a sample,
wherein the program causes the computer to
set a first threshold to the profile waveform so as to form at least two size regions which are defined based on the first threshold and the profile waveform below the first threshold;
classify the regions into first and second groups based on calculation of sizes of the regions, and
determine either or both of that a site corresponding to a region which belongs to the first group having larger regions than the second group is a concave portion or a space portion, and that a site corresponding to a region which belongs to the second group having smaller regions than the first group is a convex portion or a line portion,
wherein the program causes the computer to set a center of a second threshold obtained based on an upper peak of the profile waveform and a third threshold obtained based on a lower peak as a fourth threshold, and to set a center of a fifth threshold obtained based on a median value of an upper peak exceeding a fourth threshold and a sixth threshold obtained based on a value of a lower peak as the first threshold.

20. The non-transitory computer readable storage medium according to claim 19, wherein the program causes the computer to obtain an area inside a region for which a contour is defined by a line segment indicating the first threshold and the profile waveform.

* * * * *